United States Patent [19]
Eckstein et al.

[11] Patent Number: 5,670,018
[45] Date of Patent: Sep. 23, 1997

[54] ISOTROPIC SILICON ETCH PROCESS THAT IS HIGHLY SELECTIVE TO TUNGSTEN

[75] Inventors: Elke Eckstein, Paris, France; Birgit Hoffman, deceased, late of Pentling, Germany, by Horst Hoffman; Edward William Kiewra, Kilchberg, Switzerland; Waldemar Walter Kocon, Wappingers Falls; Marc Jay Weiss, New York, both of N.Y.

[73] Assignees: Siemens Aktiengesellschaft, Munich, Germany; International Business Machines Corporation, Armonk, N.Y.

[21] Appl. No.: 430,011

[22] Filed: Apr. 27, 1995

[51] Int. Cl.[6] .................................................. H01L 21/302
[52] U.S. Cl. ................................ 156/643.1; 156/646.1; 156/651.1; 437/192; 437/193
[58] Field of Search .............................. 156/643.1, 651.1, 156/646.1

[56] References Cited

FOREIGN PATENT DOCUMENTS 5-166761  7/1993  Japan ........................ 21/302

*Primary Examiner*—R. Bruce Breneman
*Assistant Examiner*—Julie E. Stein
*Attorney, Agent, or Firm*—Donald B. Paschburg

[57] ABSTRACT

A back end of the line dry etch method is disclosed. Etching of a mask oxide and temporary (sacrificial) silicon mandrel occurs following the formation of gate stacks and tungsten studs. The mask oxide is etched selectively to tungsten and silicon through the use of a polymerizing oxide etch. The silicon is etched selectively to both silicon nitride, silicon oxide, and tungsten. The process removes the silicon mandrel and associated silicon residual stringers by removing backside helium cooling, while using HBr as the single species etchant, and by adjusting the duration, the pressure, and the electrode gaps during the silicon etch process. The silicon may be undoped polysilicon, doped polysilicon, or single crystal silicon.

20 Claims, 4 Drawing Sheets

ISOTROPIC SILICON ETCH PROCESS THAT IS HIGHLY SELECTIVE TO TUNGSTEN

BACKGROUND OF THE INVENTION

1. Field of the Invention

The present invention generally relates to the manufacture of semiconductor devices and, more particularly, to an isotropic etch process for removing a hard-mask oxide and temporary (sacrificial) silicon mandrel used in forming tungsten studs in high density semiconductor devices, such as 64 megabyte Dynamic Random Access Memory (DRAM) chips.

2. Description of the Related Art

The use of borderless diffusion and borderless gate contact structures is an effective approach to increase the circuit integration density. For example, a fully borderless diffusion contact is permitted to overlap the gate conductor and the device isolation regions in a Dynamic Random Access Memory (DRAM) array. The resulting DRAM cell area can be reduced by approximately 40% compared with a fully-landed diffusion contact, as described, for example, by D. Kenney et al., "A Buried-Plate Trench Cell for a 64-MB DRAM", 1992 *Symposium on VLSI Technology*, Seattle, Wash. Moreover, a borderless gate-conductor contact is also permitted to overlap the isolation regions.

The conventional fabrication process requires a temporary (sacrificial) mandrel structure for the fabrication of contact vias. The mandrel may, for example, be a polysilicon structure which is globally planarized by chemical-mechanical polishing (CMP) to the level of the gate cap dielectric, plus a polysilicon extension layer which serves as an etch stop for the mask oxide.

Over this layer is formed a hard-mask oxide layer. These polysilicon layers are anisotropically etched using the oxide hard mask and a fluorine-free etch chemistry to obtain a high selectivity (>50:1) of the etch rate of polysilicon to the etch rate of the gate-cap dielectric, thereby forming high-aspect vias in the mandrel. These high-aspect-ratio vias are then filled with chemical vapor deposited (CVD) tungsten (W), and the tungsten is polished back down to the hard-mask oxide layer to form Contact to Diffusion (CD) and Contact to Gate (CG) studs.

Once the CD and CG studs have been formed, it is necessary to remove the hard-mask oxide and the temporary polysilicon mandrel layer and replace it with an insulator. Past efforts have used fluorine processes, but at least two problems result. First, although the fluorine processes are effective in removing polysilicon, they also etch tungsten quite readily. Second, the highly polymerizing fluorine chemistry tends to "clog" the reactive ion etch (RIE) chamber, requiring frequent cleaning intervals.

In light of these fluorine etch process deficiencies, $Cl_2$/HBr (Chlorine/Hydrogen Bromide) processes have been used to etch the polysilicon. These $Cl_2$/HBr processes, however, also have their own deficiencies. First, the $Cl_2$/HBr processes are not isotropic, therefore they leave enough residual polysilicon on the sidewalls of the gate stacks to cause high stud to stud leakage. And second, the $Cl_2$ also reduces the tungsten stud height which may cause open circuits.

Anisotropic processes using HBr as a single species etchant for etching silicon and polysilicon selective to a photoresist have also been utilized, however, these processes are not very selective to tungsten. Also, because they are also anisotropic, they do not remove the residual polysilicon stringers at the base of the tungsten studs.

A need exists therefore, for a method to isotropically etch the silicon remaining on the sidewall without removing too much of the tungsten stud or the dielectric gate cap.

SUMMARY OF THE INVENTION

It is therefore an object of the present invention to provide a process for removing the temporary hard-mask and silicon mandrel used in the fabrication of tungsten Contact to Diffusion (CD) and Contact to Gate (CG) studs in the manufacture of high density semiconductor devices, substantially obviating one or more of the problems resulting from the limitations and disadvantages of the related art.

It is also an object of the present invention to reduce tungsten stud loss, allowing for a decrease in mandrel extension thickness and reduced widening of contact to gate (CG) holes during CG etch. A reduction in the widening of the CG holes is deskable, as the widening of the holes results in an increase of CD to CG shorts.

According to the invention, an isotropic silicon etch process is provided comprising the steps of: (1) providing a wafer with tungsten studs having a mask oxide and silicon in contact with the tungsten studs; (2) providing backside helium cooling to the wafer; (3) plasma stripping the mask oxide with an about 3:1 ratio of $CF_4$/$CHF_3$ and Argon; (4) removing the backside helium cooling; and (5) plasma stripping the silicon with an etchant.

In another aspect, the invention provides for a silicon etch process comprising the steps of: (1) providing a wafer with tungsten studs having a mask oxide and silicon in contact with the tungsten studs; (2) providing backside helium cooling at about 12 Torr to the wafer; (3) plasma stripping the mask oxide with an about 3:1 ratio of $CF_4$/$CHF_3$ and Argon utilizing endpoint detection; (4) overetching the mask oxide for a period of about 28 percent of the endpoint detection time; (5) removing the backside helium cooling; and (6) plasma stripping the silicon with an etchant.

The above removal process occurs following the formation of the gate stacks and tungsten studs and is required to etch silicon selectively to both the gate cap dielectric and the tungsten. The gate cap dielectric may be silicon nitride or silicon dioxide. The silicon may be undoped polysilicon, doped polysilicon, or single crystal silicon. The disclosed isotropic process uses hydrogen bromide (HBr) as a single species reactant to selectively etch the silicon with respect to the tungsten and the gate cap dielectric.

Residual silicon stringers are removed by increasing the temperature of the substrate by terminating the normal helium (He) cooling of the backside of the wafers during the HBr etch. Isotropic etching with $NF_3$ and $SF_6$ can also be used to eliminate the residual silicon stringers, but tungsten stud height will be lost as a result of the fluorine chemistry.

BRIEF DESCRIPTION OF THE DRAWINGS

The foregoing and other objects, aspects and advantages will be better understood from the following detailed description of a preferred embodiment of the invention with reference to the drawings, in which.

DETAILED DESCRIPTION OF A PREFERRED EMBODIMENT OF THE INVENTION

Figure 1:
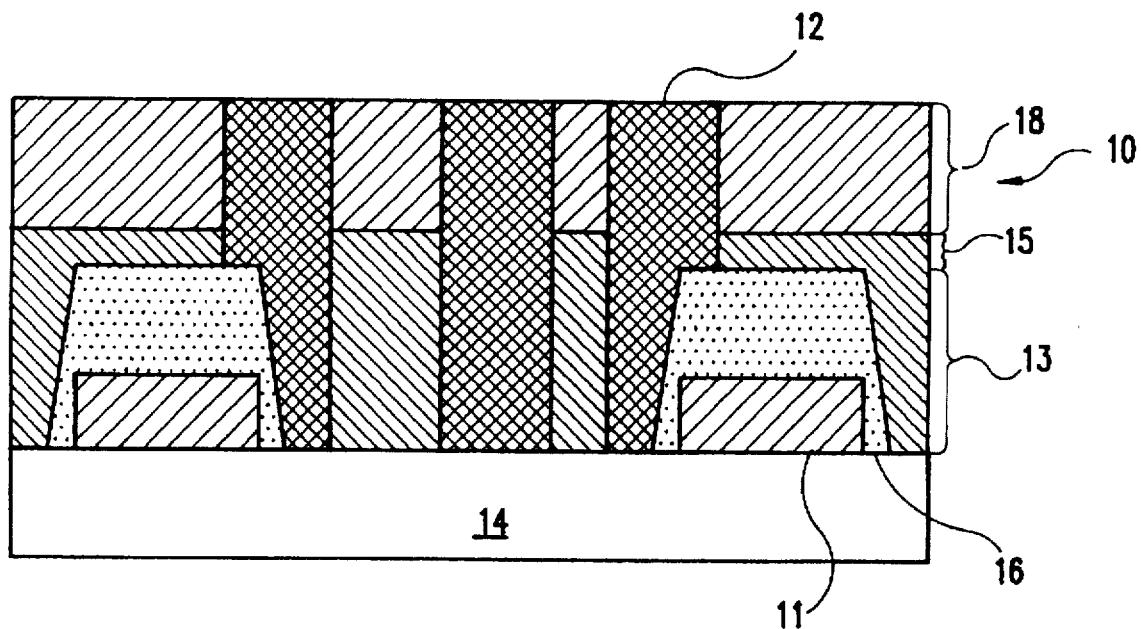
FIG. 1 is a cross-sectional view of the gate stacks and tungsten contact to diffusion (CD) studs prior to mandrel etch.
Figure 2:
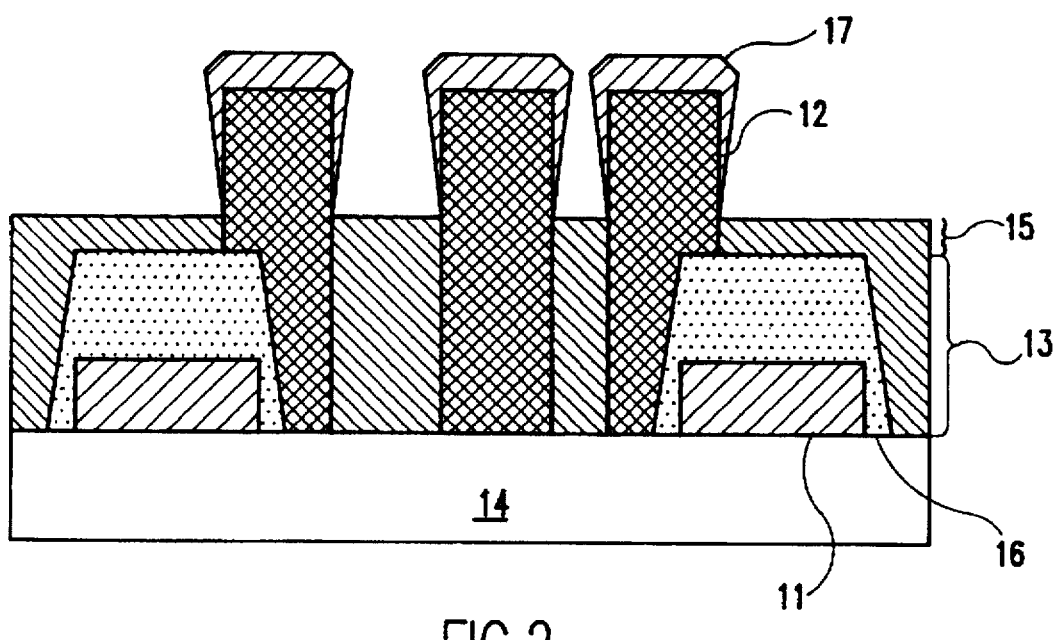
FIG. 2 is a cross-sectional view of the gate stacks and CD studs as in FIG. 1 after hard-mask oxide removal.

Referring now to the drawings, and more particularly to FIGS. 1 to 4, there is shown in FIG. 1 a cross-sectional view of a semiconductor device designated generally as reference numeral 10, and having gate stacks and Contact to Diffusion (CD) studs surrounded by a hard-mask oxide and temporary silicon mandrel, prior to a silicon etch process.

While the silicon etch process of the present invention will be described with respect to the removal of "polysilicon" layers 13 and 15, it can be appreciated that layers 13 and 15 may be formed of not only undoped polysilicon, but also doped polysilicon or single crystal silicon. The process parameters of the present invention, discussed further below, would remain approximately the same regardless of the type of silicon utilized in layers 13 and 15.

The structure of FIG. 1 will now be described. The semiconductor device 10 comprises a substrate 14 on which gate conductors 11 have been formed. The gate conductors 11 are covered by a gate-cap dielectric 16 of silicon nitride or silicon dioxide, and over this structure is formed a mandrel polysilicon layer 13 which is planarized by chemical-mechanical polishing (CMP) to the level of the gate-cap dielectric. This mandrel polysilicon layer is then extended as a polysilicon layer 15. A hard-mask oxide layer 18 is formed over the extended layer 15 to define openings to be formed in the polysilicon layers 13 and 15.

The polysilicon layers are etched using the mask and fluorine-free etch chemistry to obtain high-aspect-ratio vias in the polysilicon mandrel. These vias are filled using CVD tungsten (W) deposition followed by tungsten CMP to form the CD studs 12. The hard-mask oxide layer 18 and temporary polysilicon fill, comprising mandrel layer 13 and extended layer 15, are necessary in order to etch the borderless contacts selectively to the gate oxide cap. After fulfilling this purpose, the hard-mask oxide and polysilicon fill have to be replaced by an insulator.

The purpose of the subsequent mandrel strip process is to remove all of the mask oxide and polysilicon fill around the studs and between the gate stacks while minimizing the attack on the tungsten studs and the gate cap dielectric. A reactive ion etch (RIE) is first used to strip the hard-mask oxide layer 18. See FIG. 2. This results in mask oxide removal with minimal attack on the tungsten studs 12. A polymeric layer or film 17, mainly composed from carbon and fluorine, is formed during the mask oxide RIE. This polymer film helps to protect the tungsten from being etched, thus maintaining its stud height during the mask oxide RIE. Polymer deposition during the mask oxide RIE is required because the free fluorine would otherwise attack the tungsten.

Isotropic etching is required for the mandrel polysilicon strip process because the polymeric caps 17 on top of the studs 12 would otherwise mask the polysilicon if an anisotropic etch were used.

Figure 3:
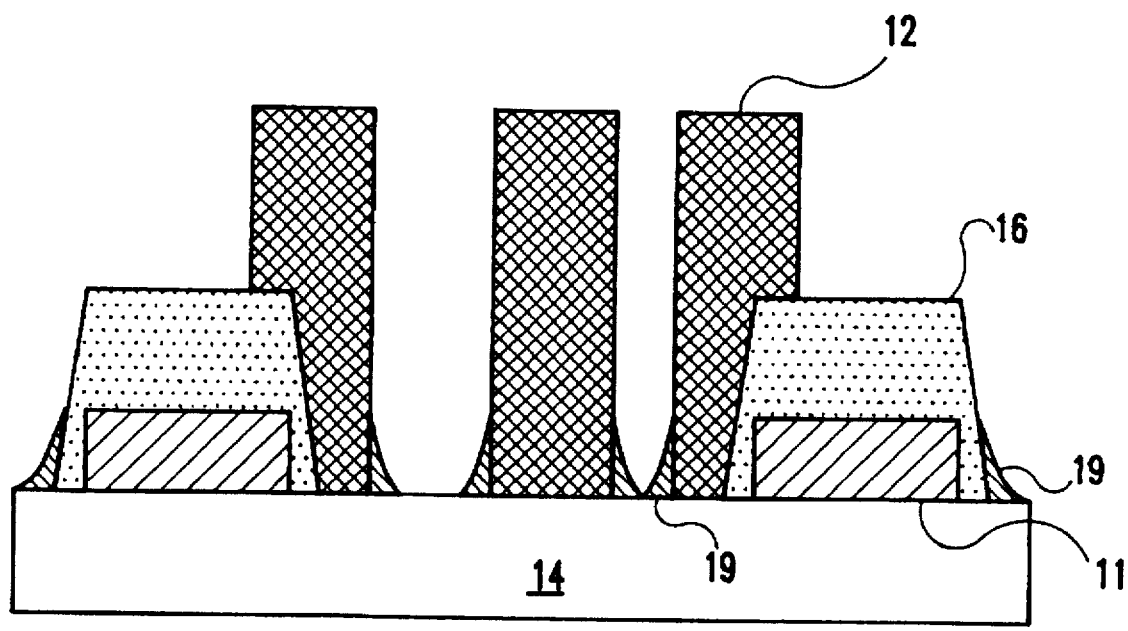
FIG. 3 is a cross-sectional view of the gate stacks and CD studs as in FIG. 2 after mandrel polysilicon etch.

FIG. 3 illustrates a conventional method of stripping the mandrel polysilicon layers 13 and 15 with HBr chemistry. Unfortunately, when using this method, some mandrel polysilicon residual stringers 19 remain attached to the base of the CD studs 12 and gate insulators 16 following this etch step. These residual stringers 19 cause stud to stud leakage and must therefore be removed.

Figure 4:
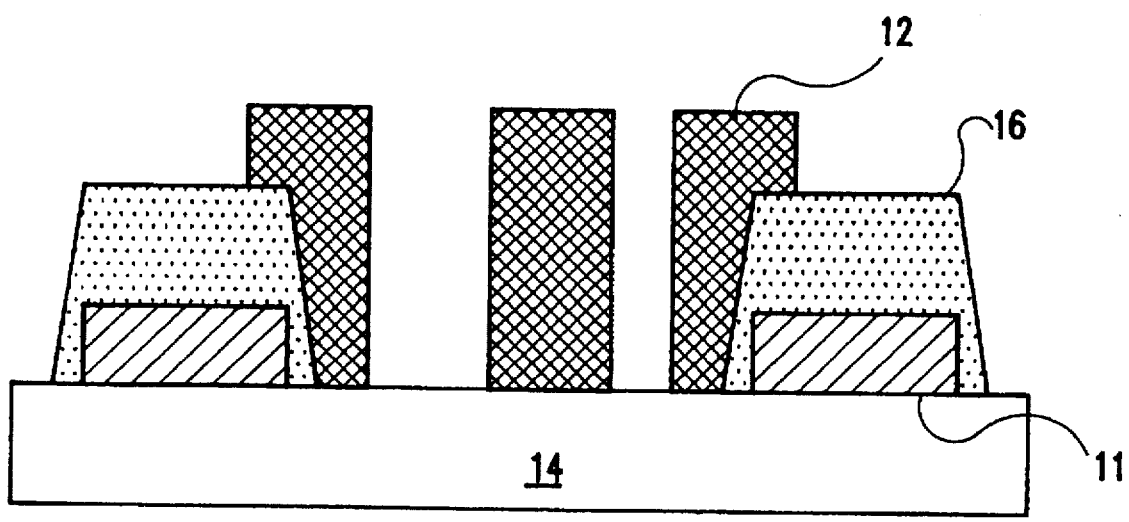
FIG. 4 is a cross-sectional view of the gate stacks and CD studs as in FIG. 3 after $NF_3$/$SF_6$ clean-up etch.

In the past, the mandrel polysilicon stringers 19 were removed using an isotropic $NF_3/SF_6$ RIE. During this clean up step, however, CD stud height was lost because of fluorine attack on the tungsten, as illustrated in FIG. 4. This is an unacceptable result since the next layer of metal in the fabrication process needs to touch the stud, otherwise, if the studs are too low, an open circuit will result.

Figure 5:
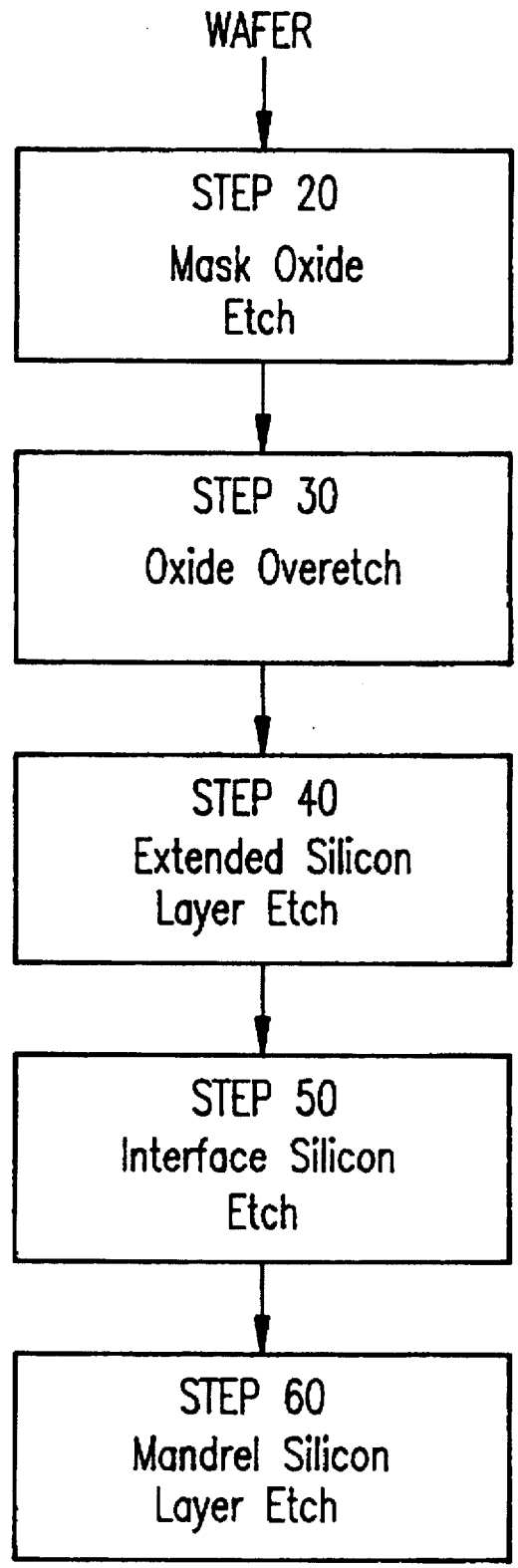
FIG. 5 is a flow chart of the steps of the present invention.

FIG. 5 represents a flow chart of the process of the present invention, which overcomes the aforementioned problem of removing the residual polysilicon stringers 19, but with minimal reduction of the CD stud height.

First, a wafer, as for example the semiconductor device 10 in FIG. 1, is prepared for etching and is provided in step 20 (see FIG. 5). In step 20, the hard-mask oxide 18 is etched using an oxide etch at approximately 240 mTorr pressure, 1200 watts power, and having an electrode gap of 1.015 cm. The hard-mask oxide can be a silicon oxide ($SiO_x$), such as silicon dioxide, which may be deposited in many ways, for example, by "cracking" of tetraethylorthosilicate (TEOS), sputtering from a $SiO_x$ target, or evaporation of $SiO_x$. Other chemical vapor depositions with precursors other than TEOS, such as $SiH_4$ and $N_2O$, may also be used to form the mask oxide.

The mask oxide etch uses an approximate combination of Ar at 200 sccm (standard cubic centimeters per minute), $CF_4$ at 60 sccm and $CHF_3$ at 20 sccm. The helium (He) clamp pressure is kept at 12 Torr during this step. The oxide etch is stopped using conventional endpoint detection, which measures the intensity of a desired wavelength with an optical spectrometer.

In step 30, the wafer may then be overetched to ensure complete hard-mask oxide removal. This step exposes the wafer to the same conditions as in the previous step 20, for a time of about 28% of that of the initial mask oxide etch in step 20.

The next three steps—steps 40, 50, and 60—demonstrate the polysilicon etch process according to the present invention. During all three steps, the helium clamp pressure is set to zero (0) Torr. By removing this backside cooling, the wafer temperatures for steps 40–60 reach on the order of 260° C. Also, during all three steps, the polysilicon is plasma stripped using HBr chemistry at about 300 sccm while the power remains constant at about 575 watts.

In step 40 the extended polysilicon layer 15 is etched. The wafer is exposed to a pressure of 650 mTorr and the electrode gap is widened from 1.015 cm in the previous step to 1.3 cm. The duration of this etch step is about 20 seconds.

In the next polysilicon etch step 50, the pressure is lowered to 350 mTorr and the electrode gap is reduced to 0.8 cm. The duration of this etch step is about 20 seconds. This step is done to "break through" any interface between the mandrel polysilicon layer 13 and the extended polysilicon layer 15.

Figure 6:
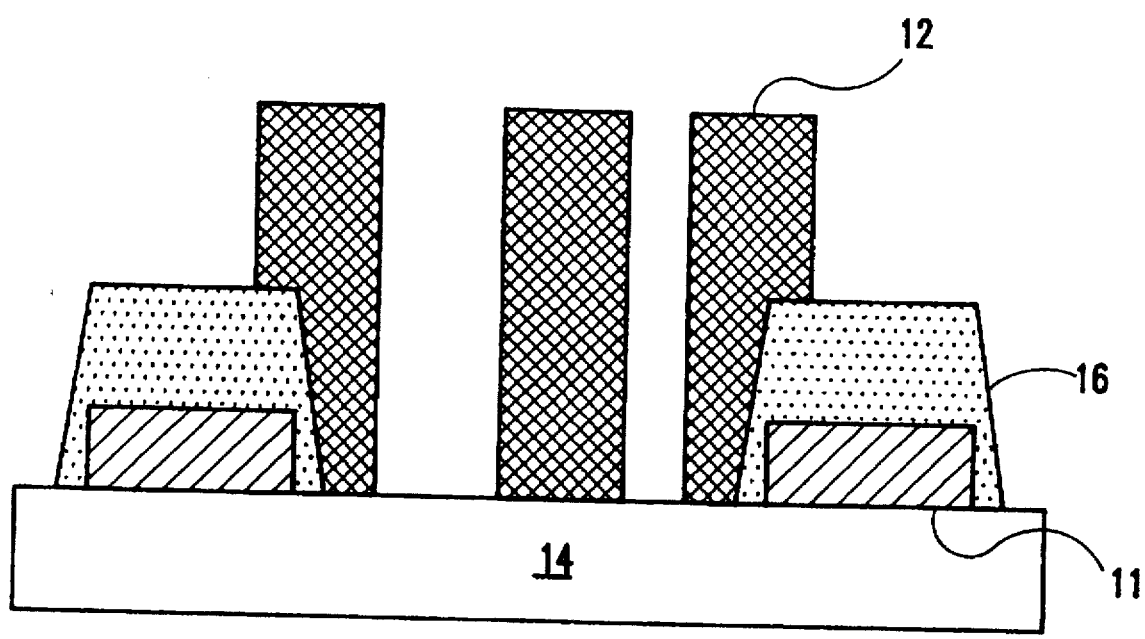
FIG. 6 is a cross-sectional view of the gate stacks and CD studs after the polysilicon is stripped with HBr chemistry and backside He cooling is turned off according to the present invention.

In the final polysilicon etch step 60 the mandrel polysilicon layer 13 is etched. For this step the pressure is returned to 650 mTorr and the electrode gap is again widened to 1.3 cm. This is the longest of the three polysilicon etch steps, lasting about 125 seconds. FIG. 6 is a cross-sectional view of the resulting gate stacks and CD studs after completion of step 60.

The process of the present invention is effective in removing the polysilicon stringers even where the above described process parameter target values (e.g., power, pressure, gas flow rate, time, and electrode gap spacing) vary by about +/−20%.

By not using $Cl_2$ and by removing the backside cooling in steps 40–60 (helium clamp pressure at zero (0) Torr), the selectivity of etching polysilicon to that of tungsten greatly increases from 6:1 to 15:1. Also, the polysilicon stringers are removed from the sidewalls while maintaining the high selectivity of polysilicon to both the tungsten studs and the gate cap dielectric.

The oxide etch steps (20 and 30) and silicon etch steps (40–60) may be performed in the same chamber or in separate chambers. That is, one can do the oxide etch, change the electrode gap, and then do the silicon etch steps in the same chamber, or use two separate chambers to perform the functions.

There are advantages, however, in using separate chambers. First, it separates the fluorine (F) used in steps 20 and 30, from the HBr chemistry used in steps 40–60. Also, the silicon etch process (i.e., getting silicon to etch selectively to tungsten and the dielectric) achieves better results when separate chambers are used.

While the invention has been described in terms of preferred embodiments, those skilled in the art will recognize that the invention can be practiced with modification within the spirit and scope of the appended claims.

Having thus described our invention, what we claim as new and desire to secure by Letters Patent is as follows:

1. An isotropic silicon etch process comprising the steps of:
   providing a wafer with tungsten studs having a mask oxide and silicon in contact with the tungsten studs;
   providing backside helium cooling to the wafer;
   plasma stripping the mask oxide with an about 3:1 ratio of $CF_4/CHF_3$ and argon;
   removing the backside helium cooling; and
   plasma stripping the silicon with an etchant.

2. A silicon etch process as in claim 1, wherein the silicon is selected from the group consisting of undoped polysilicon, doped polysilicon, and single crystal silicon.

3. A silicon etch process as in claim 1, wherein the step of plasma stripping the silicon uses HBr as an etchant.

4. A silicon etch process as in claim 3 which is selective to tungsten.

5. A silicon etch process as in claim 4 which is selective to silicon oxide or silicon nitride.

6. A silicon etch process as in claim 3, wherein the step of plasma stripping the silicon uses an approximate combination of HBr at 300 sccm, at a pressure of 650 mTorr, a power of 575 watts, and an electrode gap of 1.3 cm for about 20 seconds, then at a pressure of 350 mTorr, a power of 575 watts, and an electrode gap of 0.8 cm, for about 20 seconds, and then at a pressure of 650 mTorr, a power of 575 watts, and an electrode gap of 1.3 cm for about 125 seconds.

7. A silicon etch process as in claim 1 wherein said mask oxide is silicon oxide.

8. A silicon etch process as in claim 7, further including a step of forming the mask oxide selected from the group consisting of cracking of tetraethylorthosilicate (TEOS), sputtering from a silicon oxide target, and evaporating silicon oxide.

9. A silicon etch process as in claim 7, further including a step of forming the mask oxide by chemical vapor deposition of $SiH_4$ and $N_2O$.

10. A silicon etch process as in claim 1, wherein the step of plasma stripping the mask oxide uses an approximate combination of Ar at 200 sccm, $CF_4$ at 60 sccm and $CHF_3$ at 20 sccm, at 240 mTorr pressure, 1200 watts power, and having an electrode gap of 1.015 cm.

11. An isotropic silicon etch process comprising the steps of:
   providing a wafer with tungsten studs having a mask oxide and silicon in contact with the tungsten studs;
   providing backside helium cooling at about 12 Torr to the wafer;
   plasma stripping the mask oxide with an about 3:1 ratio of $CF_4/CHF_3$ and argon utilizing endpoint detection;
   overetching the mask oxide for a period of about 28 percent of the endpoint detection time;
   removing the backside helium cooling; and
   plasma stripping the silicon with an etchant.

12. A silicon etch process as in claim 11, wherein the silicon is selected from the group consisting of undoped polysilicon, doped polysilicon, and single crystal silicon.

13. A silicon etch process as in claim 11, wherein the step of plasma stripping the silicon is performed at about 260° C., and said etchant comprises HBr at 300 sccm and is devoid of $Cl_2$.

14. A silicon etch process as in claim 13 wherein said silicon is polysilicon, and wherein the selectivity of etching said polysilicon to said tungsten studs in the plasma stripping step is 15:1.

15. A silicon etch process as in claim 14 which is selective to silicon oxide or silicon nitride.

16. A silicon etch process as in claim 13, wherein the step of plasma stripping the silicon uses an approximate combination of a pressure of 650 mTorr, a power of 575 watts, and an electrode gap of 1.3 cm for about 20 seconds, then at a pressure of 350 mTorr, a power of 575 watts, and an electrode gap of 0.8 cm, for about 20 seconds, and then at a pressure of 650 mTorr, a power of 575 watts, and an electrode gap of 1.3 cm for about 125 seconds.

17. A silicon etch process as in claim 11 wherein said mask oxide is silicon oxide.

18. A silicon etch process as in claim 17, further including a step of forming the mask oxide selected from the group consisting of cracking of tetraethylorthosilicate (TEOS), sputtering from a silicon oxide target, and evaporating silicon oxide.

19. A silicon etch process as in claim 17, further including a step of forming the mask oxide by chemical vapor deposition of $SiH_4$ an $N_2O$.

20. A silicon etch process as in claim 11, wherein the step of plasma stripping the mask oxide uses an approximate combination of Ar at 200 sccm, $CF_4$ at 60 sccm and $CHF_3$ at 20 sccm, at 240 mTorr pressure, 1200 watts power, and having an electrode gap of 1.015 cm.

* * * * *